United States Patent [19]

Gaudenzi

[11] 4,394,588

[45] Jul. 19, 1983

[54] CONTROLLABLE DI/DT PUSH/PULL DRIVER

[75] Inventor: Gene J. Gaudenzi, Purdys, N.Y.

[73] Assignee: International Business Machines Corporation

[21] Appl. No.: 221,687

[22] Filed: Dec. 30, 1980

[51] Int. Cl.³ .................. H03K 5/08; H03K 17/08; H03K 19/082; H03K 19/20

[52] U.S. Cl. .................. 307/443; 307/254; 307/263; 307/454; 307/563

[58] Field of Search ............... 307/254, 454, 456–458, 307/443, 546, 562, 563, 547, 263, 270

[56] References Cited

U.S. PATENT DOCUMENTS

| | | | |
|---|---|---|---|
| 3,529,184 | 9/1970 | Conklin | 307/290 |
| 3,531,660 | 9/1970 | Engberg | 307/270 |
| 3,562,549 | 2/1971 | Teichmann | 307/458 X |
| 3,757,138 | 9/1973 | Bhatia et al. | 307/562 X |
| 3,824,408 | 7/1974 | Brunel | 307/268 X |
| 3,902,079 | 8/1975 | Ahmed | 307/254 X |
| 3,958,136 | 5/1976 | Schroeder | 307/270 X |
| 4,251,737 | 2/1981 | Caudenzi | 307/270 X |
| 4,321,490 | 3/1982 | Bechdolt | 307/458 X |

OTHER PUBLICATIONS

"Driver Latch Circuit", by D. Eardley, IBM Tech. Disc. Bull., vol. 19, No. 7, Dec. 1976, pp. 2528-2529.
"Universal Latch", by F. Montegari, IBM Tech. Disc. Bull., vol. 19, No. 10, Mar. 1977, pp. 3743-3744.

Primary Examiner—Larry N. Anagnos
Assistant Examiner—David R. Hudspeth
Attorney, Agent, or Firm—Sughrue, Mion, Zinn, Macpeak and Seas

[57] ABSTRACT

A driver circuit to limit the di/dt downgoing transition to a desired value employs an active feedback path. The driver circuit utilizes a Schottky Barrier Diode as a current bleed to limit the base current of the drive circuit transistor. The active feedback path includes a normally conductive transistor which turns off when the output falls to a predetermined level. Elimination of the active feedback path in this condition insures maximum DC drive.

6 Claims, 2 Drawing Figures

CONTROLLABLE DI/DT PUSH/PULL DRIVER

FIELD OF THE INVENTION

This invention relates to LSI systems. In particular, it relates to an off-chip driver to allow switching of multiple drivers while limiting the di/dt current for the downgoing transition.

BACKGROUND OF THE INVENTION

LSI systems typically utilize active collector drivers which switch to down levels very fast because of the required DC drive to hold a given $T^2L$ down level. Referring to FIG. 1, the transition curve for such a typical driver DVR is shown with a dotted line curve for di/dt (rate of change of output current). The curves demonstrate the high level of di/dt and $I_{peak}$ current for $I_0$. The voltage induced in the on-chip stripe inductance L can be represented as $V_L = Ldi/dt$. If a significant number of drivers (n) are switched at once, this value of $V_L$, if high enough, may cause other drivers to falsely switch. Moreover, the total "on-chip" voltage use is significant because it limits the "on-chip" noise margin.

Within the prior art, techniques to limit the Ldi/dt voltage on an LSI chip have employed straddle capacitors. While such capacitors are effective to limit this induced voltage, a heavy penalty is incurred in terms of the usable chip area required for such elements. Typically, straddle capacitors require an area of approximately 10 mil². Accordingly, an ongoing requirement exists to preserve the DC drive capability while limiting the Ldi/dt voltage yet requiring only a minimum amount of chip area on the LSI. The use of straddle or feedback capacitors is therefore not effective to satisfy these diverse requirements.

Given the existance of the stripe inductance L as a physical property, the on-chip wires and the inexorable increase in the number of drivers switching as logic chip density increases, the only effective way to limit total "on-chip" voltage is by control of di/dt. However, the prior art has not utilized this approach, preferring conventional capacitor techniques. As mentioned, such an approach may be satisfactory where chip area is no concern. But, in contemporary LSI devices, this is a primary aspect of design.

U.S. Pat. No. 3,867,649 shows a feedback capacitor circuit for a pair of identical drivers driving an MOS device. This patent shows the prior art use of a feedback capacitance 52. In operation, when the output of a particular driver falls, a current equal to CdV/dt is developed in the feedback capacitance 52. This current flow is utilized to divert current from the base of the transistor 48 and additionally, to slow down the fall time when the output is changing between levels, diodes 62 and 64 are utilized with the voltage divider resistors 70 and 72 to provide a controlled unidirectional feedback. Accordingly, spiking of the output is limited by diverting current from the base of the transistor 48.

Distinct from capacitance techniques, the consideration of active feedback circuit potentially offers one technique for meeting these diverse criteria.

U.S. Pat. No. 3,529,184 shows in FIG. 2 a modification of a Schmitt Trigger Circuit having an input voltage $e_n$, and a transistor 14 with its emitter coupled to ground via emitter coupled resistor 20. An output, normally conductive, transistor 22 is coupled in a common emitter fashion to transistor 14. The emitter coupled resistor 20, in common with both transistor emitters, provides positive feedback resulting in the well known triggering action of the circuit. In order to overcome the inherent voltage drop across resistor 20 when transistor 22 is conductive, the '184 patent provides a feedback transistor 34. The emitters of output transistor 22 and feedback transistor 34 are connected to ground so that when the transistor 22 becomes fully conductive, the voltage at the collector falls substantially to ground potential. Accordingly, in the Schmitt Trigger Circuit of FIG. 2 of this patent, the base line voltage is substantially nearer to zero than is the case in conventional circuitry. U.S. Pat. No. 3,571,625 shows a pulse amplifier circuit having a feedback transistor 135 active only during transitions of the input pulses. The base-emitter diode of transistor 135 prevents any feedback through the series-connected resistors during application of the constant value voltage portion of the input voltage. However, during transitions in the signal applied to transistor 115 saturates the base-emitter junction of that transistor, transistor 125 is substantially cut off. A positive voltage at collector 127 forward biases the base-emitter diode of transistor 135 and current flows through resistors 131 and 133 enhancing the conduction of the transistor 115. Accordingly, positive feedback occurs only during pulse transitions.

Other patents specifically considered but not deemed to be pertinent include U.S. Pat. Nos. 3,555,306; 3,824,408; 3,971,961; 3,978,347; and 4,167,682. While the prior art shows several types of active switching devices, they either relate to the use of feedback capacitors as in the case of the '649 patent thereby incurring the heavy penalty of requiring large amounts of chip area or, do not minimize propagation delays in the switching of multiple drivers.

SUMMARY OF THE INVENTION

Given the deficiencies in the prior art, it is an object of this invention to provide an active feedback driver circuit that limits di/dt in a controllable manner so that multiple drivers can be switched while minimizing propagation delays.

A further object of this invention is to preserve the DC drive capability in an active collector driver circuit.

Yet another object of this invention is to provide for a feedback circuit that limits negative going output ground voltage swings during driver circuit transition.

Yet another object of this invention is to provide for a driver circuit delivering active collector-type AC performance while eliminating the need for feedback capacitors.

A further object of this invention is to control transitions to discreet values by setting resistance levels in the feedback circuit.

Yet another object of this invention is to protect the output transistor from excessive power dissipation if the output is accidentally touched by a high level of voltage.

These and other objects of this invention are accomplished by having a driver circuit employing an active feedback path to limit the downgoing transition induced voltage di/dt to any desired value. The driver circuit utilizes a Schottky Barrier Diode to act as a current bleed to limit the base current of the drive circuit transistor. The active feedback path includes a normally conductive transistor which turns off when the output falls to a predetermined level. Elimination of the active feedback path in this condition insures a maximum DC drive.

This invention will be described in greater detail by referring to the accompanying drawing and a description of the preferred embodiment that follows.

DESCRIPTION OF THE PREFERRED EMBODIMENT

Figure 2:
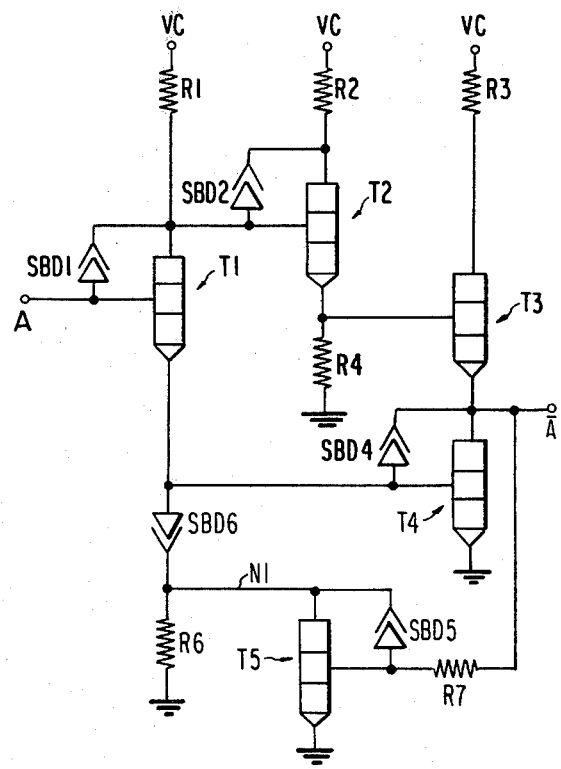
FIG. 2 is a circuit diagram showing a preferred embodiment of the present invention.

Referring now to FIG. 2, the driver circuit of the present invention is shown. The driver circuit utilizes a first input transistor T1 together with second and third transistors T2, T3 in a cascaded manner. Transistors T1, T2, and T3 all receive a power supply voltage VC. Transistors T1 and T2 have Schottky Barrier Diodes SBD1 and SBD2 respectively coupled between base and collectors of the transistors to prevent those transistors from being driven into saturation. In such a driver circuit, when T1 is off, the base of T2 receives the input voltage A, turning on that transistor. T2 then turns on T3 in a well known cascaded fashion.

Figure 1:
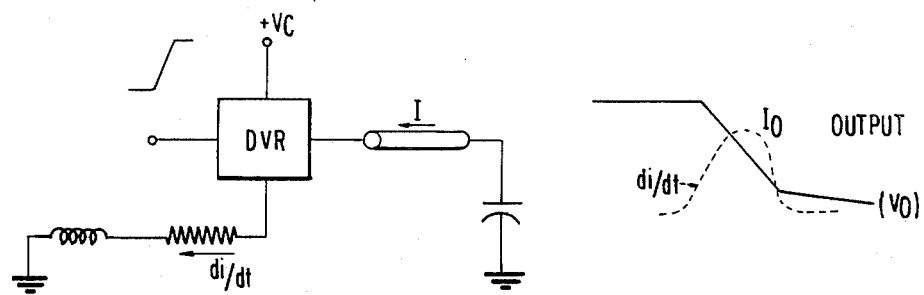
FIG. 1 is a schematic drawing showing a driver circuit and the transition voltage during switching.

The present invention employs an active feedback along path N1 to limit the downgoing transition as shown in FIG. 1 or, di/dt to any desired value. If the feedback loop were not present when transistor T1 turned on, T4 would immediately be rendered conducting and the output A would be reduced. To control the transition rate which occurs when the input voltage A is increased, the present invention utilizes a Schottky Barrier Diode SBD6, transistor T5 and resistor R7 in the circuit shown in FIG. 2.

The loop composed of the base-emitter junction of T4, SB6 includes the collector-base junction of T5 whose voltage is clamped by the forward biased Schottky SBD5.

In accordance with the present invention, output transistor T4 is not allowed to turn-on quickly because it must follow T5. T5 is limited by the feedback resistor R7 together with the down-going output waveform. If $V_{SBD6} \equiv V_{SBD5}$ then:

$$V_{BE_{T4}} = V_{BE_{T5}} - V_{SBD5} + V_{SBD6}$$
$$V_{BE_{T4}} \approx V_{BE_{T5}}$$

Accordingly, the value of di/dt of transistor T5 may be designed to any desired value by choice of R1 and R7. Resistor R6 is required to discharge the base of T4 when switching to the UP level and does not actively control or enter into the operation of di/dt control.

Considering first the case when the output $\bar{A}$ is up with the input A down, transistor T5 is rendered conducting, attempting to clamp the feedback path N1 nearly to ground. If, for example, the output $\bar{A}$ is 3.5 V, N1 would be at approximately 0.3 V. The transistor T4 is off.

When the input is high, T1 turns on, thereby switching the output down reducing $\bar{A}$. The Schottky Barrier Diode SBD6 acts as a current bleed limiting the base current to transistor T4. The current bleed allows control of the downgoing transition, di/dt to any desired value. As the output $\bar{A}$ falls to the $\phi$ level, approximately 600 MV, transistor T4 turns on and T5 turns off. With transistor T5 rendered non-conducting, the feedback path no longer exists. Maximum DC drive then exists. AC delays for the down-going transition are slowed down because of the slower $\Delta v/\Delta t$ required to reduce di/dt. For example, if $\Delta v/\Delta t$ is reduced from 2 v/ns to 1 v/ns, by implementing active feedback, driver delays are increased by 2 ns for the down-going transition. However, di/dt is reduced by approximately 62%, allowing more drivers to be simultaneously switched.

Accordingly, as the output voltage $\bar{A}$ falls, T5 which initially was "on" moves toward the cut-off region and consistently removes base drive from output transistor T4. This operation coupled with $V_{BE_{T4}} \sim V_{BE_{T5}}$ limits the di/dt of the output device. When the output falls below the $T^2L$ ($\phi$) requirement, transistor T5 is completely off allowing full base drive for output transistor T4. The resistor R7 can be varied to control transitions to discreet values.

By the use of an active feedback path, a significant reduction in the amount of chip area also occurs. Prior art straddle capacitors require chip areas in the range of 10 mil$^2$. However, the present invention requires approximately 1.5 mil$^2$, thereby resulting in a 6X saving in chip area.

In constructing the circuit of FIG. 2 Schottky Barrier Diodes SBD5 and SBD6 should be of the same design. This allows (a) $V_{BE_{T4}} \sim V_{BE_{T5}}$ (during switching)
(b) eliminates any error due to process (device $\pm 3\sigma$ variations).

To demonstrate this aspect of the invention, it has been determined that a 1.25 pf feedback capacitor will limit $\Delta v/\Delta t$ to acceptable values. Assuming 0.132 pf/mil$^2$ of capacitance can be developed on-chip, it is determined about 10.24 mil$^2$ is required for 1.25 pf of total capacitance. The implementation of elements SBD6/T5 and R7 require about 1.5 mil$^2$, thereby resulting in a sixfold saving in chip area.

This invention can be modified without departing from the essential aspects thereof. For example, the resistor R7 while shown as a fixed resistor, can be adjustable to control the transition at discreet values. Additionally, the Schottky Barrier Diode SBD6, which is utilized as a current bleed, can be replaced with a resistance element.

The invention is shown in FIG. 2 as an active collector type circuit, however, the essential aspects can be practiced by operating the circuit as an open collector type circuit. In the open collector mode, transistors T2 and T3 would be eliminated and the collector of output transistor T4 "open". Circuit operation would be the same as described.

It is apparent that other modifications can be made while remaining in the scope of this invention.

I claim:

1. A circuit for limiting the time-rate of change of down-going transitions of a signal present at the output terminal of an active collector driver, comprising a first transistor having a base coupled to a signal input terminal and a collector coupled to a means for providing a supply voltage and an emitter coupled to ground, a second transistor having a collector coupled to said output terminal and an emitter coupled to ground for pulling-down said signal present at said output terminal to a low state, impedance means coupled to said first transistor and the base of said second transistor for limiting the base current of said second transistor, pull-up means coupled to said output terminal for pulling-up said signal present at said output terminal to a high state, a feedback path coupled to said output terminal and said impedance means for limiting said time-rate of change of said downgoing transition of said output signal, and switch means for clamping said feedback path to ground.

2. The circuit of claim 1 wherein said impedance means comprises a Schottky barrier diode coupled in parallel with the base-emitter junction of said second transistor.

3. The circuit of claim 2 wherein said switch means comprises a third transistor, which receives said output signal, said third transistor rendered conductive when the output signal is at a high state relative to said input and cut off to eliminate said feedback path when the input is at a high state relative to said output and said second transistor is conducting.

4. The circuit of claim 3 further comprising resistor means coupled in said feedback path to control the cutoff point of said third transistor.

5. The circuit of claim 1 further comprising Schottky barrier diodes coupled across the base and collector of said first and second transistors to prevent said first and second transistors from being saturated.

6. The circuit of claim 1 further comprising an output coupled to said second transistor, wherein if the output of said second transistor is low, said feedback path will limit the current in said second transistor if a high level voltage is applied to said output.

* * * * *

UNITED STATES PATENT AND TRADEMARK OFFICE
CERTIFICATE OF CORRECTION

PATENT NO. : 4,394,588
DATED : July 19, 1983
INVENTOR(S) : Gene J. Gaudenzi

It is certified that error appears in the above—identified patent and that said Letters Patent are hereby corrected as shown below:

Column 3, line 32, "A" should be "$\overline{A}$".

Column 3, line 64, "$T_{\underline{4}}$" should be "$T_4$".

Signed and Sealed this

Thirtieth Day of October 1984

[SEAL]

Attest:

GERALD J. MOSSINGHOFF

Attesting Officer

Commissioner of Patents and Trademarks